United States Patent
Wang et al.

(10) Patent No.: US 7,265,990 B2
(45) Date of Patent: Sep. 4, 2007

(54) CHIPSET COUPLING APPARATUS

(75) Inventors: Frank Wang, Taipei (TW); Chih-Kai Yang, Taipei (TW)

(73) Assignee: Inventec Corporation, Taipei (TW)

( * ) Notice: Subject to any disclaimer, the term of this patent is extended or adjusted under 35 U.S.C. 154(b) by 108 days.

(21) Appl. No.: 11/130,283

(22) Filed: May 17, 2005

(65) Prior Publication Data

US 2006/0264078 A1 Nov. 23, 2006

(51) Int. Cl.
*H05K 1/14* (2006.01)

(52) U.S. Cl. .................. 361/740; 361/687; 361/688; 361/807

(58) Field of Classification Search ............ 257/707, 257/691, 692, 700, 706; 439/259; 361/704
See application file for complete search history.

(56) References Cited

U.S. PATENT DOCUMENTS 5,057,031 A * 10/1991 Sinclair ..................... 439/261
5,302,853 A * 4/1994 Volz et al. ................. 257/707
5,722,848 A * 3/1998 Lai et al. ................... 439/342
6,071,128 A * 6/2000 Brewington et al. ......... 439/73
6,191,480 B1 * 2/2001 Kastberg et al. ........... 257/727
6,198,630 B1 * 3/2001 Cromwell .................. 361/704
6,205,026 B1 * 3/2001 Wong et al. ............... 361/704
6,527,577 B1 * 3/2003 Chen et al. ................ 439/342
7,074,068 B1 * 7/2006 Ma ........................... 439/331
7,101,209 B2 * 9/2006 Yates et al. ................ 439/331
2004/0228095 A1 * 11/2004 Lee et al. .................. 361/704

* cited by examiner

*Primary Examiner*—Tuan T. Dinh
*Assistant Examiner*—Hung S. Bui
(74) *Attorney, Agent, or Firm*—Birch, Stewart, Kolasch & Birch, LLP

(57) ABSTRACT

A chipset coupling apparatus mounted onto a chipset-coupling seat of a printed circuit board includes a compression plate, which has an opening to allow a cooling section of a chipset to extend there through. The compression plate has anchor members on two opposite sides to latch on the chipset coupling seat. The compression plate can press the pin board of the chipset and enable the anchor members and the chipset coupling seat to form a latch relationship, so that a heat sink may be removed from the chipset, without removing the chipset at the same time, to avoid damage of the pins on the chipset.

5 Claims, 3 Drawing Sheets

CHIPSET COUPLING APPARATUS

FIELD OF THE INVENTION

The invention relates to a coupling apparatus adopted for use on electronic products that have a printed circuit board such as a motherboard used in computers and particularly to a coupling apparatus for removing chipsets without damaging the pins.

BACKGROUND OF THE INVENTION

With rapid development and progress of electronic technologies, the performance of desktop computers or notebook computers increases tremendously. Now these computers are widely used by companies, enterprises and consumers. The powerful performance of these electronic products mainly relies on the high performance chipset used in the central processing unit (CPU) and the like. Due to the advance of semiconductor manufacturing technology, the size of the chipset has not increased very much in the last few years. However, the transistor number inside the chipset has increased many times. Nowadays fabrication specification of the chipset has reached a micro or nano meter level, and the number of transistors in one chipset could be hundred millions or more.

With the operation clock and the number of transistors of the chipset increasing constantly, power consumption and operation temperature of the chipset also increase. At present most chipsets adopt an air cooling mechanism through fans, or a water cooling mechanism using an operation fluid with a low boiling temperature to transmit and disperse the high temperature generated by the chipset during operation, to avoid overheating and damaging of the chipset.

The chipset is mounted onto a printed circuit board (PCB) such as the motherboard. The PCB has a dedicated chipset-coupling seat to receive the chipset. Then a heat sink, such as fans or a water cooling system is mounted onto the top of the chipset, to transfer the heat energy to the exterior to reduce the temperature of the chipset.

As the heat energy generated by the chipset increases constantly while operating, the contact area between the chipset and the heat sink also increases. Coupling of the heat sink and the chipset mostly is done through a viscous heat dissipation paste. Increasing of the contact area between the heat sink and the chipset also increases the viscosity. During assembly of the chipset it often happens that the chipset is removed from the heat sink. This is a forceful operation and often results in bending or even fracturing of the pins on the chipset. The chipset could be damaged and not usable.

SUMMARY OF THE INVENTION

In view of the aforesaid problems, the present invention aims to provide a chipset coupling apparatus that can install the chipset securely on a chipset coupling seat and prevent the chipset from being damaged while the heat sink is removed. The structure is simple and may be fabricated at a low cost. Installation also is easy.

The chipset coupling apparatus according to the invention is adaptable to PCBs used in computer equipment such as personal computers, notebook computers, and servers that have a motherboard or the like. The PCB has a chipset-coupling seat to receive insertion of the chipset. The chipset coupling seat has two latch hooks on two opposite sides. The chipset includes a pin board and a cooling section. The cooling section is located on the top of the pin board in a protrusive manner. The pin board has a coupling surface on the topside. The chipset coupling apparatus of the invention includes a compression plate, which has an opening to separate a compression area. The compression plate has two anchor members located on two opposite sides. Each anchor member has a latch trough corresponding to the latch hook. When the chipset is inserted in the chipset-coupling seat, the compression area presses the coupling surface and the cooling section passes through the opening. The latch hooks and the latch troughs may be coupled to latch the compression plate on the chipset coupling seat. The compression plate has a levering member on one side close to the anchor member to receive the force of a user, so that the compression plate may deformed slightly to release the coupling relationship between the latch hooks and the latch troughs.

By pressing the compression plate on the coupling surface of the pin board, and coupling the anchor members with the latch hooks of the chipset coupling seat, when the heat sink is removed from the chipset, the chipset is prevented from being removed therewith. Hence damages such as bending or fracturing of the pins on the chipset may be avoided, and a desired protection mechanism for the chipset is provided.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENT

Figure 1:
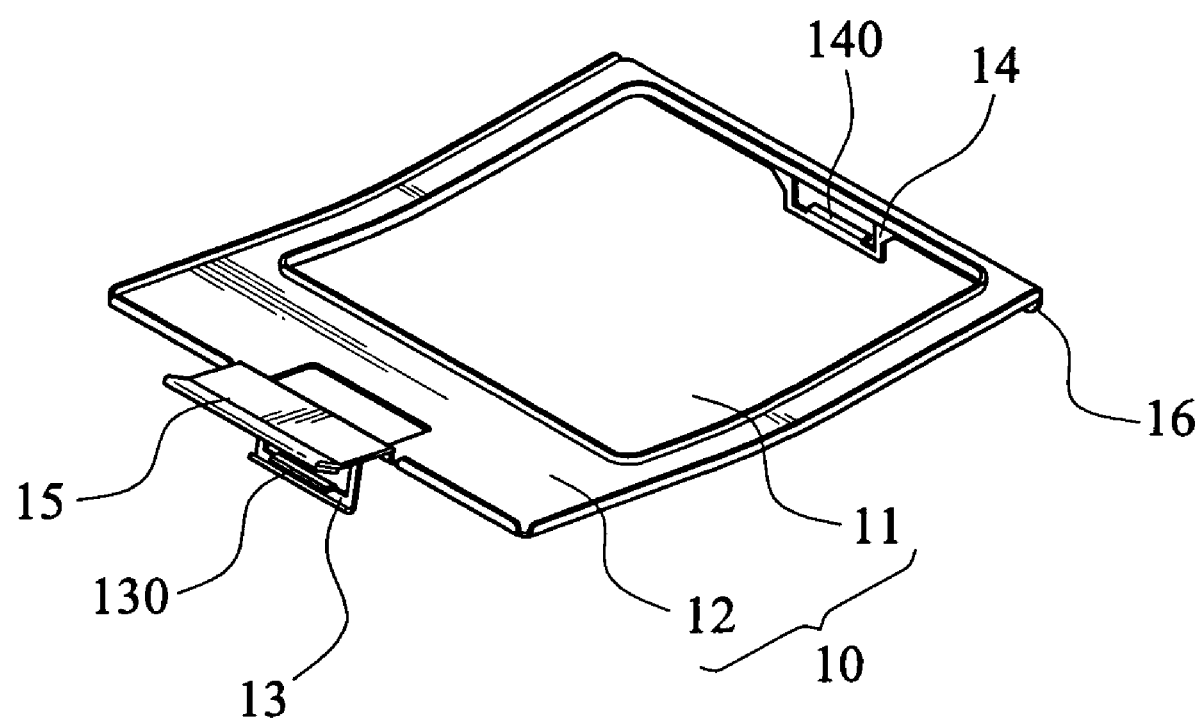
FIG. 1 is a schematic view of the chipset coupling apparatus of the invention.
Figure 2:
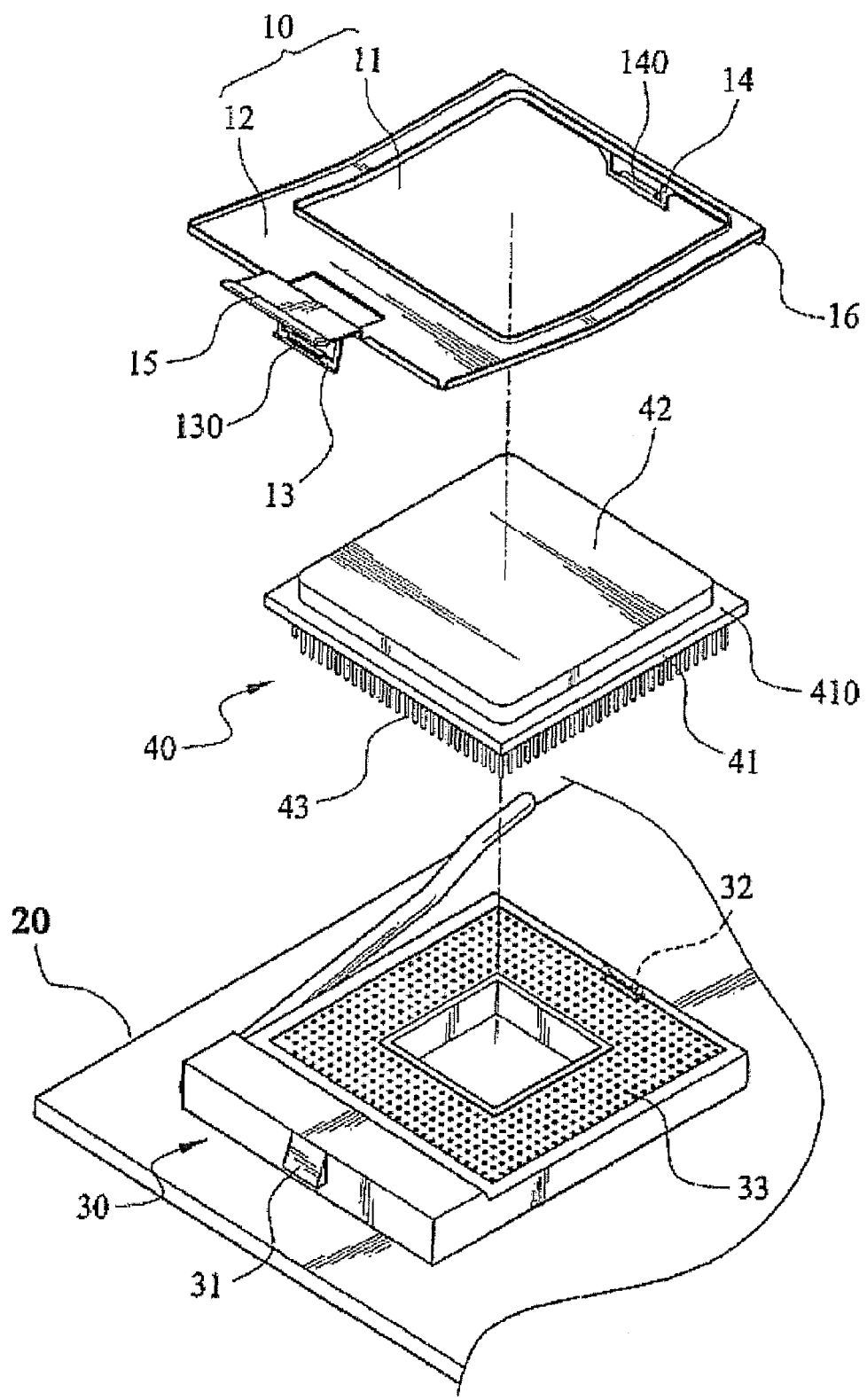
FIG. 2 is an exploded view of the chipset coupling apparatus of the invention.
Figure 3:
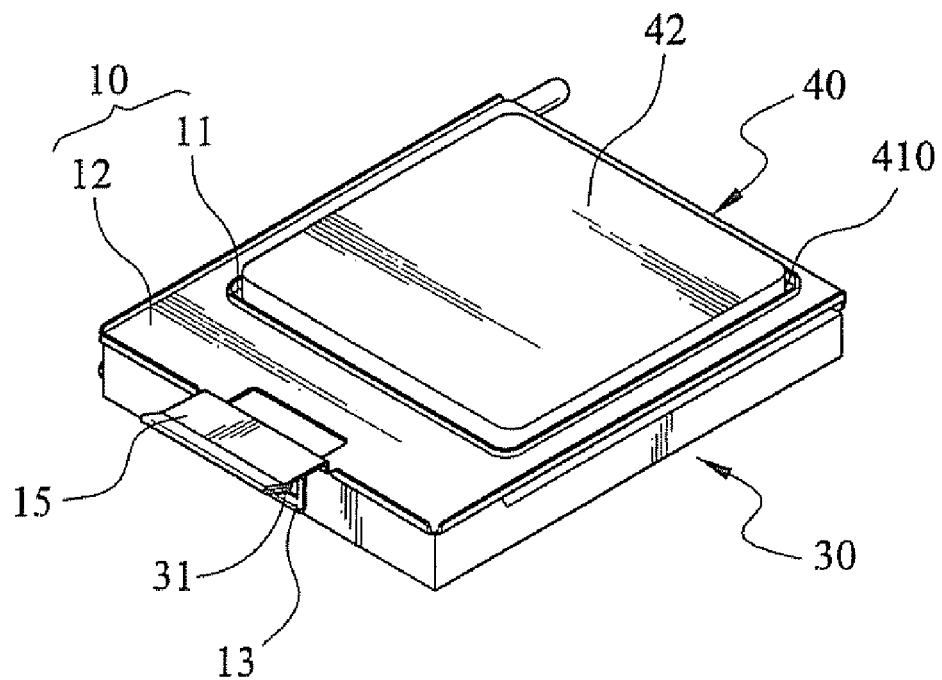
FIG. 3 is a schematic view of the chipset coupling apparatus of the invention after it has been assembled.

Referring to FIGS. 1 through 3, the chipset coupling apparatus according to the invention is mainly adopted for use on a printed circuit board (PCB), 20 such as a motherboard, used in various computer equipment, that includes personal computers, notebook computers, servers, and the like.

The PCB 20 has a chipset-coupling seat 30 to receive insertion of a chipset 40. The chipset-coupling seat 30 has a first latch hook 31 and a second latch hook 32 on two opposite sides, and apertures 33 corresponding to pins 43 of the chipset 40. The chipset 40 includes a pin board 41 and a cooling section 42. The pin board 41 has the pins 43 on one side corresponding to the chipset coupling seat 30 that are insertable into the apertures 33 to transmit data. The cooling section 42 is located on the top of the pin board 41 in a protrusive manner. The pin board 41 further has a coupling surface 410 on the topside. A heat sink that might include a fan is bonded to the topside of the cooling section 42 to transfer heat energy from the chipset 40.

The chipset coupling apparatus of the invention is fabricated by stamping and bending. It includes a compression plate 10, a first anchor member 13, a second anchor member 14 and a levering member 15. The compression plate 10 has an opening 11 to separate a compressing area 12 on the compression plate 10. The first anchor member 13 and the second anchor member 14 are located respectively on two opposite sides of the compression plate 10. The first anchor member 13 and the second anchor member 14 have respectively a first latch trough 130 and a second latch trough 140, corresponding to the first latch hook 31 and the second latch hook 32. The levering member 15 is located on one side of the compression plate 10, abutting the first anchor member 13. In practice, the first anchor member 13 is formed on the levering member 15. The compression plate 10 further has a retaining wall 16 on another side abutting the second anchor member 14 to facilitate alignment and positioning of the compression plate 10 on the chipset coupling seat 30. After the chip set 40 has been inserted into the chipset coupling seat 30, the compression area 12 of the compression plate 10 may be disposed to press the coupling surface 410 of the chipset 40, and the cooling section 42 may be extended through the opening 11. The latch hooks 31 and 32 are latched on the latch troughs 130 and 140, so that the compression plate 10 can latch on the chipset coupling seat 30. Therefore, when removing the heat sink (not shown in the drawings) from the top side of the chipset 40, the chipset 40 is anchored securely on the chipset coupling seat 30 by means of the latching relationship between the compression plate 10 and the chipset coupling seat 30, without being removed from the heat sink.

Figure 4:
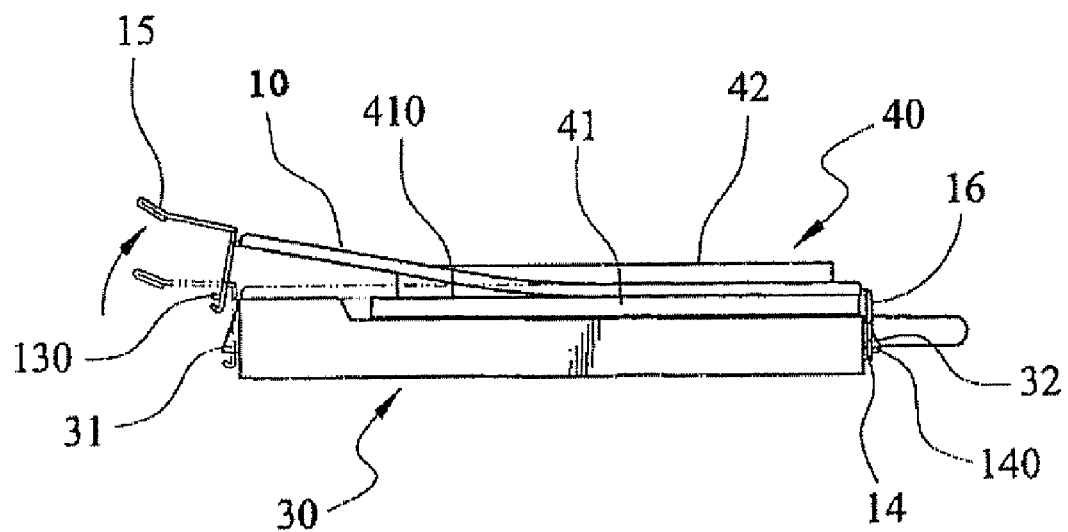
FIG. 4 is a schematic view of the chipset coupling apparatus of the invention in an operating condition.

Referring to FIG. 4, to remove the chipset coupling apparatus of the invention, exert a force on the levering member 15 to lift and deform the compression plate 10 slightly, the first latch hook 31 may be disengaged from the first latch trough 130, then the chipset coupling apparatus may be removed from the chipset coupling seat 30.

The invention provides a firm coupling by pressing the compression plate 10 on the coupling surface 410 of the pin board 41 of the chipset 40, and latching between the anchor members 13 and 14 and the latch hooks 31 and 32. Thus when the heat sink on the chipset 40 is removed, the chipset 40 remains latched without being removed. Therefore bending or fracturing of the pins 43 on the chipset 40 may be avoided, and a desired protection for the chipset 40 is provided. The structure is simple, assembly and disassembly is easy, and production costs are low. It offers a significant improvement over conventional techniques.

While the preferred embodiments of the invention have been set forth for the purpose of disclosure, modifications of the disclosed embodiment of the invention as well as other embodiments thereof may occur to those skilled in the art. Accordingly, the appended claims are intended to cover all embodiments, which do not depart from the spirit and scope of the invention.

What is claimed is:

1. A chipset coupling apparatus adopted for use on a printed circuit board, having a chipset coupling seat to receive insertion of a chipset, the chipset coupling seat having two latch hooks, the latch hooks being located on each of two opposite sides of the chipset coupling seat, the chipset having a pin board and a cooling section, the cooling section being extended from a top side of the pin board, and the top side having a coupling surface thereon, comprising:

a compression plate having an opening to separate a compression area;

two anchor members, the anchor members being formed on each of two opposite sides of the compression plate, each anchor member having a latch trough corresponding to the latch hook such that, when the chipset is inserted in the chipset coupling seat, the compression plate presses the coupling surface, the cooling section extends through the opening, and the latch hook couples with the latch trough to allow the compression plate to latch onto the chipset coupling seat; and a levering member located on one side of the compression plate, the levering member abutting one of the anchor members to receive a force of a user to lift and deform the compression plate, thereby releasing the coupling between the latch hook and the latch trough.

2. The chipset coupling apparatus of claim 1, wherein the chipset coupling apparatus is fabricated by stamping and bending.

3. The chipset coupling apparatus of claim 1, wherein one of the anchor members is connected to the levering member.

4. The chipset coupling apparatus of claim 1, wherein the compression plate has a retaining wall on each of the two opposite sides abutting the anchor members.

5. A chipset coupling apparatus adopted for use on a printed circuit board, having a chipset coupling seat to receive insertion of a chipset, the chipset coupling seat having two latch hooks, the latch hooks being located on each of two opposite sides of the chipset coupling seat, the chipset having a pin board and a cooling section, the cooling section being extended from a top side of the pin board, and the top side having a coupling surface thereon, comprising:

a compression plate having an opening to separate a compression area;

two anchor members, the anchor members being formed on each of two opposite sides of the compression plate, each anchor member having a latch trough corresponding to the latch hook such that, when the chipset is inserted in the chipset coupling seat, the compression plate presses the coupling surface of the chipset and latches between the anchor members and latch hook, the cooling section extends through the opening, and the latch hook couples with the latch trough to allow the compression plate to latch onto the chipset coupling seat; and a levering member located on one side of the compression plate, the levering member abutting one of the anchor members to receive a force of a user to lift and deform the compression plate, thereby releasing the coupling between the latch hook and the latch trough;

wherein the chipset remains securely anchored to the chipset coupling seat by means of the latching relationship between the compression plate and the chipset coupling seat when a heat sink is removed from the top side of the chipset.

* * * * *